US005184302A

United States Patent [19]

Ishida et al.

[11] Patent Number: 5,184,302

[45] Date of Patent: Feb. 2, 1993

[54] ENGINE CONTROL APPARATUS INCLUDING A/D CONVERTER FAILURE DETECTION ELEMENT AND METHOD THEREFOR

[75] Inventors: Yasuhiko Ishida; Katsuhiko Kondo, both of Himeji, Japan

[73] Assignee: Mitsubishi Denki K.K., Tokyo, Japan

[21] Appl. No.: 647,967

[22] Filed: Jan. 30, 1991

[30] Foreign Application Priority Data

Feb. 8, 1990 [JP] Japan .................................. 2-30250

[51] Int. Cl.[5] ........................ G05B 23/02; H03M 1/10

[52] U.S. Cl. .............................. 364/431.11; 123/479; 341/120; 371/8.1; 371/57.1

[58] Field of Search ...................... 364/424.03, 431.03, 364/431.04, 431.11, DIG. 2, 943.9, 943.91, 944.3, 944.9, 945.7, 947.5, 265, 266, 266.6, 268, 269.2; 123/479; 341/120, 155; 371/25.1, 57.1, 8.1

[56] References Cited

U.S. PATENT DOCUMENTS

| | | | |
|---|---|---|---|
| 3,813,647 | 5/1974 | Loo | 395/575 |
| 4,093,849 | 6/1978 | Baxter, Jr. et al. | 364/413.08 X |
| 4,580,220 | 4/1986 | Braun et al. | 364/431.11 |
| 4,584,645 | 4/1986 | Kosak | 364/431.11 |
| 4,629,907 | 12/1986 | Kosak | 364/431.11 X |
| 4,704,685 | 11/1987 | Martinsons et al. | 364/431.11 |
| 4,722,406 | 2/1988 | Naito | 73/862.17 X |
| 4,780,826 | 10/1988 | Nakano et al. | 364/431.11 X |
| 4,829,449 | 5/1989 | Polesnak | 364/510 |
| 4,837,454 | 6/1989 | Ishii et al. | 364/431.11 X |
| 5,058,021 | 10/1991 | Scott | 364/431.04 |
| 5,060,540 | 10/1991 | Yamaguchi | 74/866 |
| 5,099,241 | 2/1992 | Gulczynski | 341/159 |
| 5,107,427 | 4/1992 | Peter et al. | 364/424.03 |
| 5,126,537 | 6/1992 | Kadwell et al. | 219/501 |

FOREIGN PATENT DOCUMENTS

| | | |
|---|---|---|
| 3322240 | 1/1988 | Fed. Rep. of Germany . |
| 3621937 | 1/1988 | Fed. Rep. of Germany . |
| 3708998 | 10/1988 | Fed. Rep. of Germany . |
| 62-18041 | 1/1987 | Japan . |

*Primary Examiner*—Thomas G. Black
*Assistant Examiner*—Thomas S. Auchterlonie
*Attorney, Agent, or Firm*—Sughrue, Mion, Zinn, Macpeak & Seas

[57] ABSTRACT

An engine control apparatus includes an operational condition detecting device for detecting the operational condition of an engine, an A/D converter for converting an analog output from the operational condition detecting device into a digital output, an abnormality detecting device for detecting an abnormality in the A/D converter, an arithmetic circuit for calculating a control quantity for the engine based on the digital output of the A/D converter and a driver for actuating selected devices included in the engine in accordance with the control quantity. According to one aspect of the invention, the control quantity for the engine is replaced by a control quantity calculated based on a previously determined fixed value based on whether an abnormal state in the A/D converter is detected. According to another aspect of the invention, the driver performs the actuation of the sections of the engine in accordance with a control quantity from a backup circuit, which resets the arithmetic circuit when an abnormal state in the A/D converter is detected. Methods of operating a control system in the event of A/D converter failure are also discussed.

4 Claims, 7 Drawing Sheets

ENGINE CONTROL APPARATUS INCLUDING A/D CONVERTER FAILURE DETECTION ELEMENT AND METHOD THEREFOR

BACKGROUND OF THE INVENTION

1. Field of the Invention

The present invention relate to an engine control apparatus.

2. Discussion of Background

FIG. 1 shows the construction of a conventional electronic control apparatus for an internal combustion engine which is shown in, for instance, Japanese Unexamined Patent Publication No. 162341/1984. In FIG. 1, a reference numeral 1 designates an air cleaner, a numeral 2 designates a hot wire type air flow sensor to detect an intake air quantity in an intake air pipe 17, a numeral 3 designates an intake air temperature sensor to detect the temperature of air in the intake air pipe 17, a numeral 4 designates a throttle valve to control an intake air quantity to an engine 16, a numeral 5 a throttle opening sensor connected to the throttle valve 4 to thereby detect a degree of opening of the throttle valve, a numeral 6 a surge tank, a numeral 7 a bypass intake air quantity control valve disposed in a bypass passage 18 which bypasses between the upstream side and the downstream side of the throttle valve 4, a numeral 9 a water temperature sensor attached to a conduit for cooling water which is used for cooling the engine, a numeral 10 an injector disposed at each cylinder, which injects fuel at an amount determined by an ECU 15, a numeral 11 an intake air valve driven by a cam (not shown), a numeral 12 a cylinder, a numeral 13 a crank angle sensor to detect a crank angle of the engine 16 as well as the revolution speed of the engine, and a numeral 14 a neutral detection switch which detects that the engine 16 is in a non-load state.

In the conventional engine control apparatus having the construction described above, the ECU 15 operates in such a manner that it determines a fuel injection quantity on the basis of the outputs of the air flow sensor 2, the crank angle sensor 13 and the water temperature sensor 9, and it performs fuel injection by driving the injector 10 in synchronism with the signal of the crank angle sensor 13. The outputs from the intake air temperature sensor 3, the throttle opening sensor 5 and the neutral detection switch 14 are used as auxiliary parameters. The ECU 15 also performs the control of the intake air quantity control valve 7.

FIG. 2 shows the construction of the ECU 15 in detail.

A digital interface 151 is an interface circuit which receives digital signals from the crank angle sensor 13 and the neutral detection switch 14, and the digital interface 151 outputs the signal to a port or an interruption terminal provided at a central processing unit (CPU) 152.

An analogue interface 153 is an interface circuit which receives analogue signals from the air flow sensor 2, the throttle opening sensor 5, the water temperature sensor 9 and the intake air temperature sensor 3. The output signals of the analogue interface 153 are successively selected by a multiplexer 154. The selected signals are inputted into an A/D converter 155 in which the signals are subjected to A/D conversion, and A/D converted signals are taken as digital values in the CPU 152.

The CPU 152 is a known microprocessor including an ROM 1521 which stores control programs and data, an RAM 1522 and a timer 1523. The CPU 152 is so operated that a signal representing a pulse width for fuel injection which is calculated in accordance with a control program is generated through the output of the timer so that a driving circuit 156 drives the injector 10 to inject fuel in accordance with the pulse width. Further, the CPU 152 generates a signal representing an ISC driving pulse width which is calculated in accordance with a predetermined control program through the output of the timer so that a driving circuit 157 drives the intake air quantity control valve 7 in accordance with the determined pulse width.

Although the conventional engine control apparatus improves the accuracy of control by the digital arithmetic operations wherein the operational conditions of the engine 16 are detected through the sensors; the outputs of the sensors are converted into digital values by the A/D converter 155, and a fuel supply quantity to the engine 16 is calculated on the basis of the digital values, it has such a problem that when an A/D output value becomes abnormal, especially, when A/D converter 155 fail due to a malfunction or breaks down, a normal control of the engine can not be expected.

In the conventional engine control apparatus, a malfunction of each of the sensors 2, 3, 5, 9 or the analogue interface 153 was detected to effect the normal control for the engine. In such technique, a predetermined value was previously set in the analogue interface 153 so that the values from voltage of each of the sensors 2, 3, 5, 9 input to the A/D converter (the values were possible values in all circumstances) fell within respective predetermined ranges, and the determination that a malfunction had occurred only when the output value of the A/D converter was out of the respective predetermined ranges in the above-mentioned conditions. In the conventional apparatus, however, the judgment of malfunction was not made with respect to the A/D converter 155 itself. Also, it was possible to identify a malfunction if the A/D converter 155 was broken down and when A/D conversion values which were out of the ranges determined for each of the sensors 2, 3, 5, 9 were output. However, it was impossible to detect the malfunction when the A/D conversion values were within the ranges for the sensors. Accordingly, a fuel supply quantity was calculated on the basis of incorrect information on the A/D output values and the injector 10 was operated on the basis of incorrect calculation values to thereby cause misfiring of the engine or an engine stoppage.

SUMMARY OF THE INVENTION

It is an object of the present invention to provide an engine control apparatus capable of eliminating the reduction of the controllability due to an incorrect A/D output values calculations in the control apparatus.

The foregoing and other objects of the present invention have been attained by providing an engine control apparatus which comprises an operational condition detecting means to detect the operational condition of an engine, an A/D converter for converting an analogue output from the operational condition detecting means into a digital output, an abnormality detecting means to detect abnormality in the A/D converter, an arithmetic means for calculating a control quantity for the engine on the basis of the output of the A/D converter, and for calculating the control quantity for the engine on the basis of a previously determined fixed value in place of the A/D converted value when an abnormal state in the A/D converter is detected, and a driving means to actuate sections to be controlled of the engine in accordance with the control quantity.

Further, in accordance with the present invention, there is provided an engine control apparatus which comprises an operational condition detecting means for detecting the operational condition of an engine, an A/D converter for converting an analogue output from the operational condition detecting means into a digital output, an abnormality detecting means for detecting abnormality in the A/D converter, an arithmetic means for calculating a control quantity for the engine on the basis of the output of the A/D converter, a backup circuit for generating the control quantity for the engine and to reset the arithmetic means when an abnormal state in the A/D converter is detected, and a driving means for actuating sections to be controlled of the engine in accordance with the control quantity from the arithmetic means and for actuating the sections to be controlled of the engine in accordance with the control quantity from the backup circuit when the arithmetic means is reset.

In the first embodiment, a control quantity for the engine is calculated on the basis of the output of the A/D converter when the converter operates normally while and the control quantity for the engine is calculated on the basis of a predetermined fixed value when an abnormality in the A/D converter is detected.

In the second embodiment, a control quantity for the engine is calculated on the basis of the A/D converter to thereby drive sections to be controlled of the engine when the A/D converter operates normally and the sections to be controlled of the engine are driven on the basis of an engine control quantity produced from a backup circuit when an abnormality in the A/D converter is detected.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
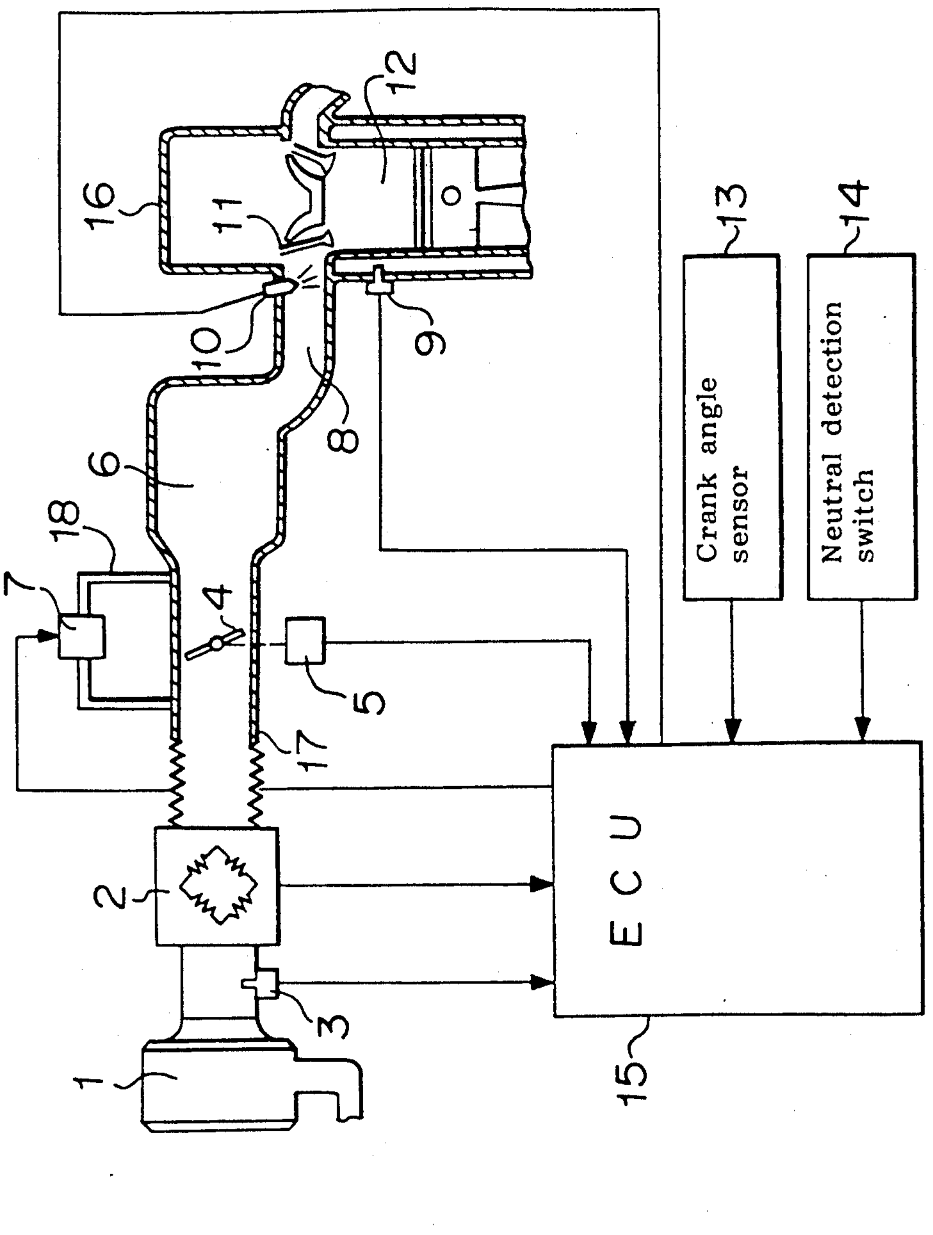
FIG. 1 is a block diagram showing the construction of a typical engine control apparatus which can be applied to a conventional apparatus and an embodiment of the present invention.

Referring to the drawings, preferred embodiments of the engine control apparatus of the present invention will be described.

Figure 2:
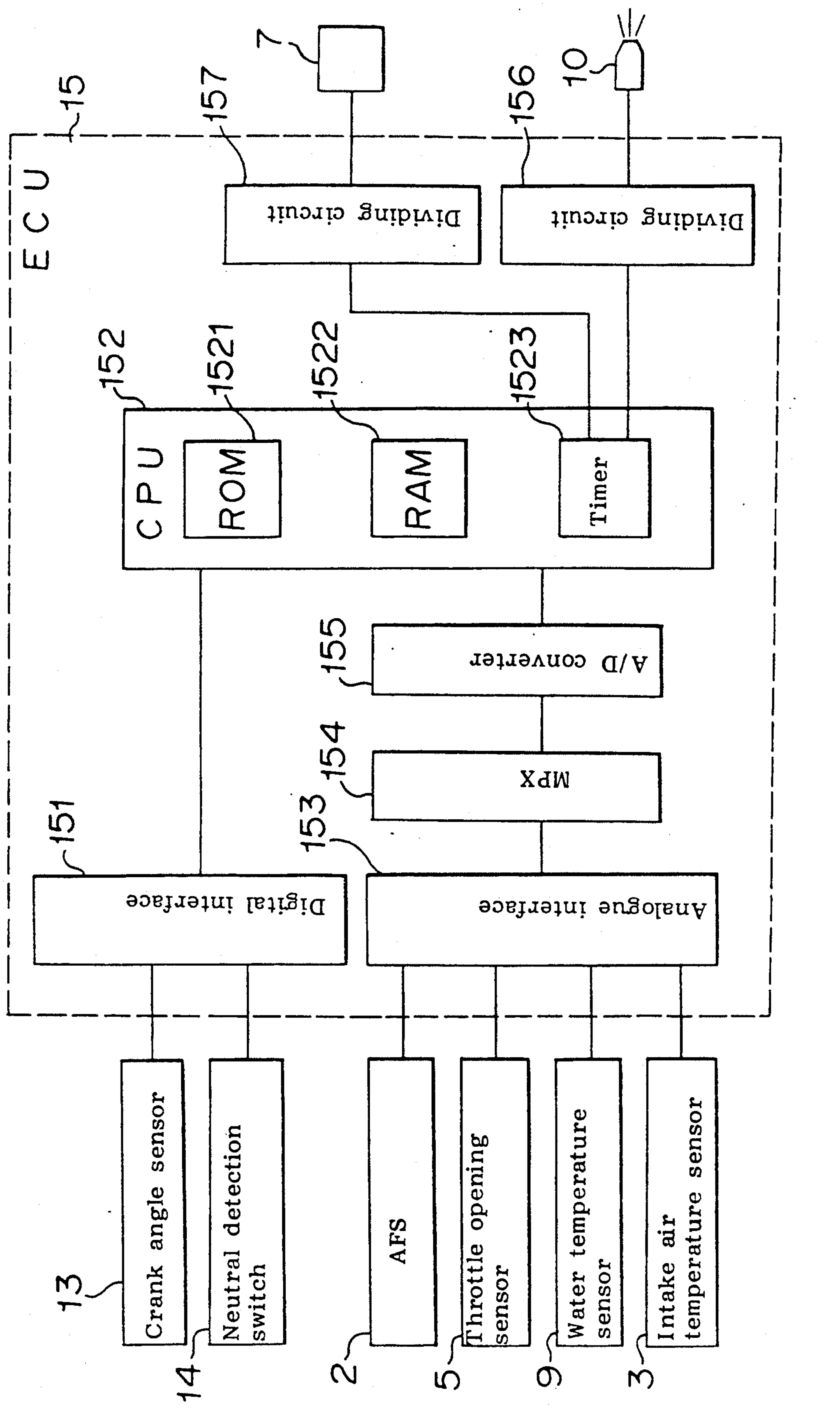
FIG. 2 is a block diagram showing the construction of an ECU which is applicable to the conventional apparatus and an embodiment of the present invention.
Figure 3:
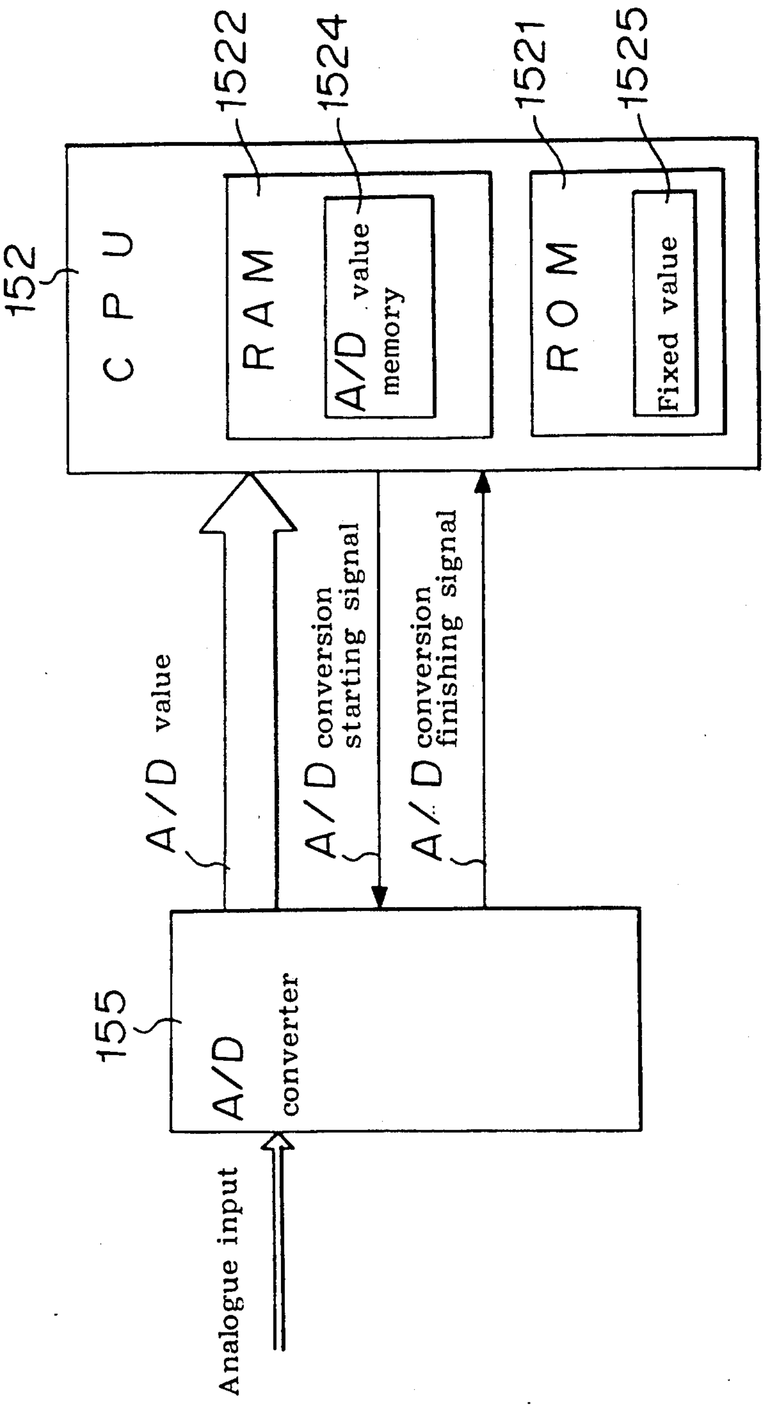
FIG. 3 is a diagram showing the operation of main parts of the engine control apparatus according to a first embodiment of the present invention.

FIG. 3 is a diagram showing the operations of the main parts of the first embodiment of the present invention. The entire structures of the engine control apparatus and the ECU 15 are the same as those shown in FIGS. 1 and 2.

In FIG. 3, a numeral 1524 designates an A/D converted value memory in an RAM 1522, and a numeral 1525 represents a fixed value stored in an ROM 1521.

The operation of the first embodiment of the engine control apparatus will be described.

The CPU 152 outputs an A/D conversion starting signal to the A/D converter 155. The A/D converter 155 starts converting operation by receiving the triggering signal, and when the converting operation is finished, it outputs an A/D converted value to the CPU 152, and outputs A/D conversion finishing signal to the CPU 152.

The CPU 152 recognizes the completion of the A/D conversion by receiving the A/D conversion finishing signal, and the A/D value is stored in the A/D value storing memory 1524. The CPU 152 calculates a control quantity for the engine on the basis of the A/D value and the output of the digital interface 151, and the driving circuits 156, 157 drive respectively the intake air quantity control valve 7 and the injector 10 in accordance with the control quantity.

Before each operation, determination is made as to whether or not the A/D conversion finishing signal is input to the CPU 152 from the A/D converter 155. When the signal is not input to the CPU 152, the judgment that the A/D converting operation is correctly conducted, is made. On the other hand, when the A/D conversion finishing signal is input to the CPU, the judgment that the A/D converter 155 is in a malfunction condition is made. Then, the A/D converting operation in the converter 155 was stopped; a fixed value 1525 which is previously set in the ROM 1521 is moved to the A/D value storing memory 1524 for each of the sensors and the fixed value is used for calculating a fuel control quantity in place of the A/D conversion value, and fuel control is conducted on the basis of the calculated fuel control quantity.

Figure 4:
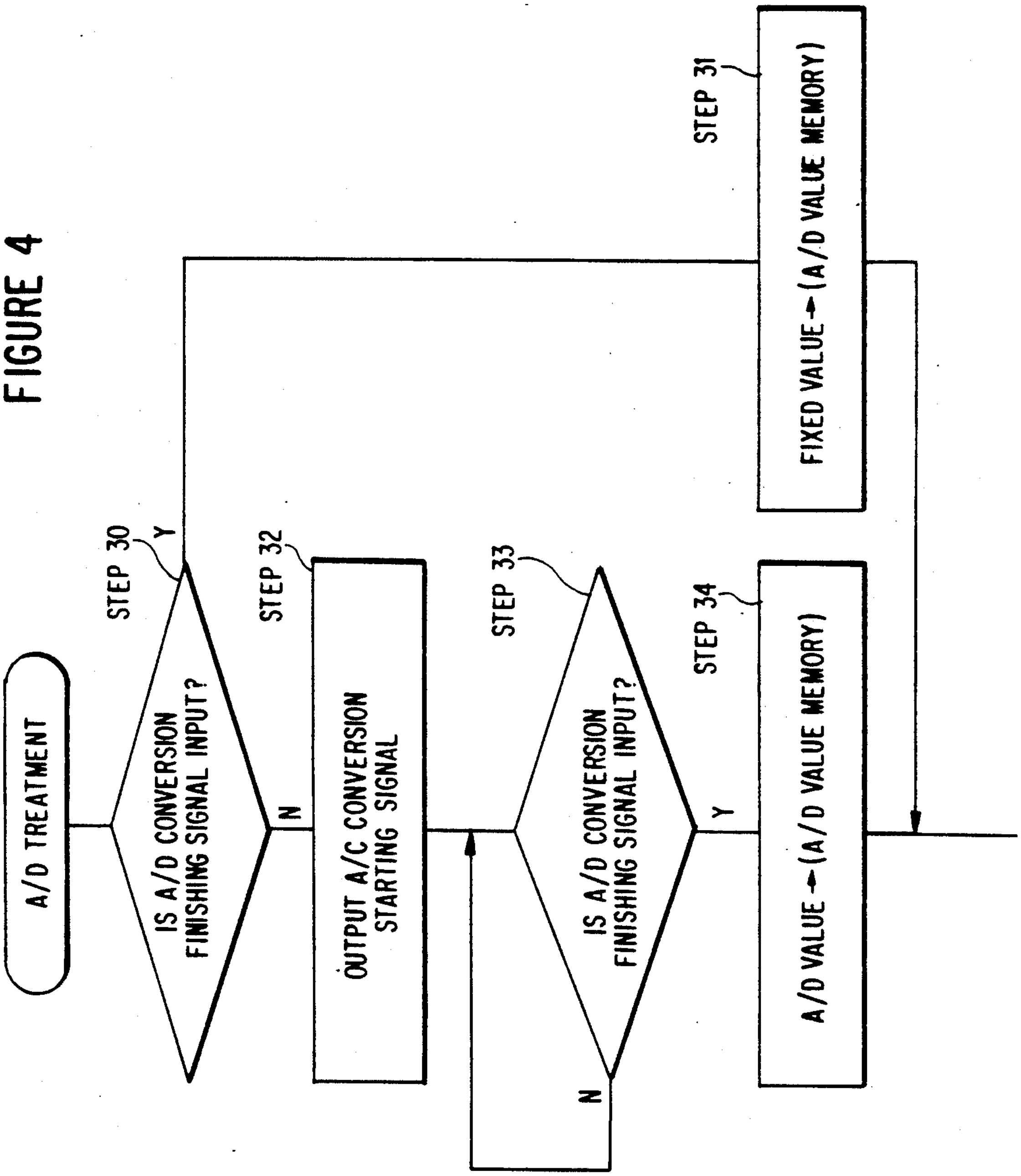
FIG. 4 is a flow chart showing the operation of the first embodiment of the engine control apparatus according to the present invention.

FIG. 4 is a flow chart showing the A/D converting operation, which will be described below.

At Step 30, determination is made as to whether or not the A/D conversion finishing signal is inputted to the CPU 152. When the determination is affirmative, the judgment that the A/D converter 155 is in erroneous operation state is made, and the fixed value 1525 is stored in place of the A/D conversion value in the A/D value storing memory 1524 at Step 31.

When the A/D conversion finishing signal is not inputted to the CPU 152, the A/D conversion starting signal is output from the CPU 152 to the A/D converter 155 at Step 32.

At Step 33, determination is made as to whether or not the A/D conversion finishing signal of the A/D converter 155 is inputted to the CPU 152. When the determination is affirmative, the A/D conversion value is stored in the A/D value memory 1525 at Step 34.

Thus, in the first embodiment of the present invention, when an abnormality in the A/D converter 155 is detected, the preset fixed values are is used in place of the A/D conversion values to obtain the control quantity for the engine. Accordingly, it is possible to prevent an erroneous control operation due to incorrect information from the A/D converter 155 to thereby avoid the worst case conditions, i.e., an engine stoppage or an engine break down.

Figure 5:
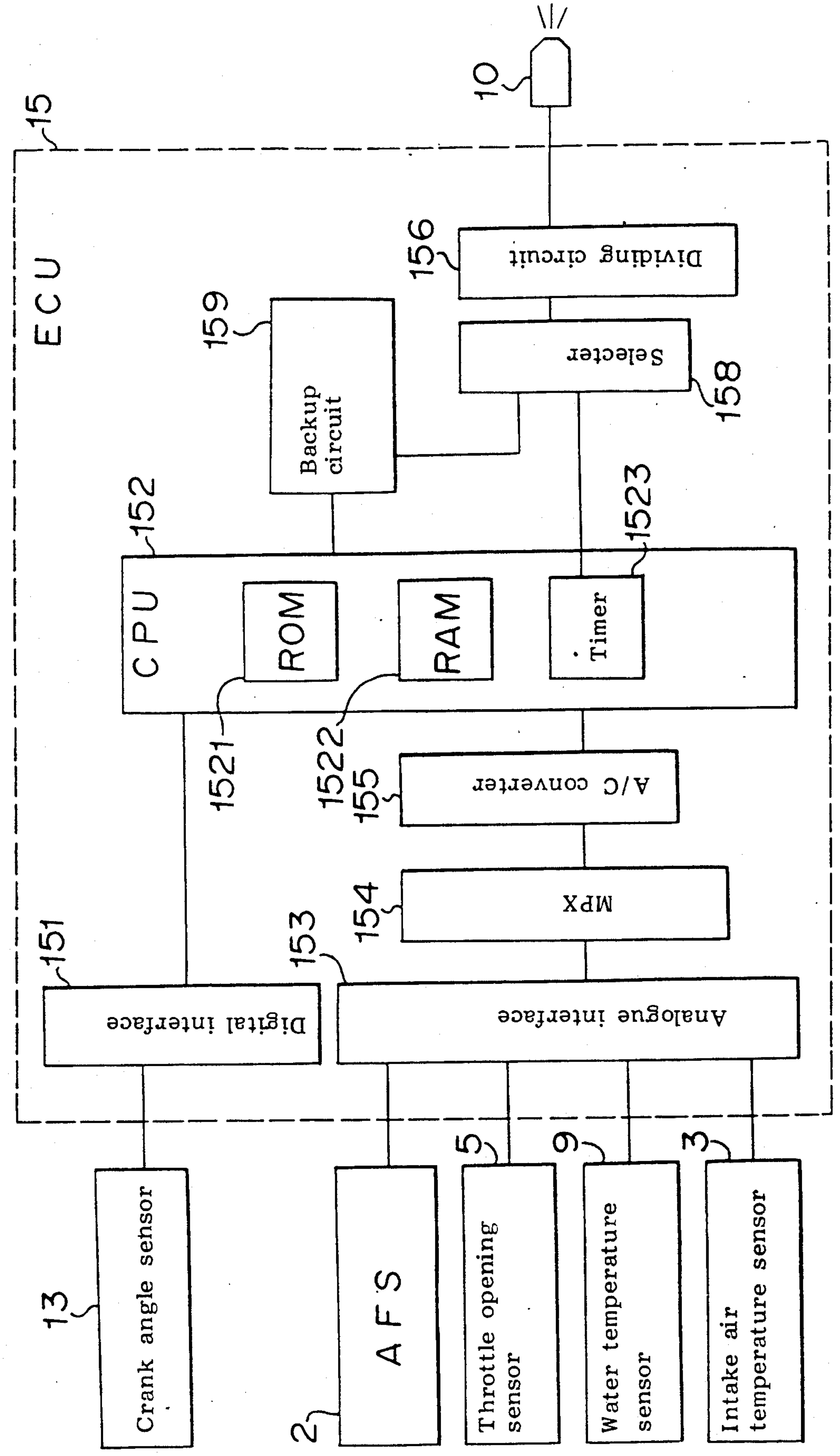
FIG. 5 is a block diagram showing the construction of an ECU for a second embodiment of the engine control apparatus of the present invention.

FIG. 5 is a block diagram showing the detail of the ECU 15 in accordance with the second embodiment of the present invention. In the second embodiment of the present invention, the ECU performs the control of only the injector 10.

Figure 6:
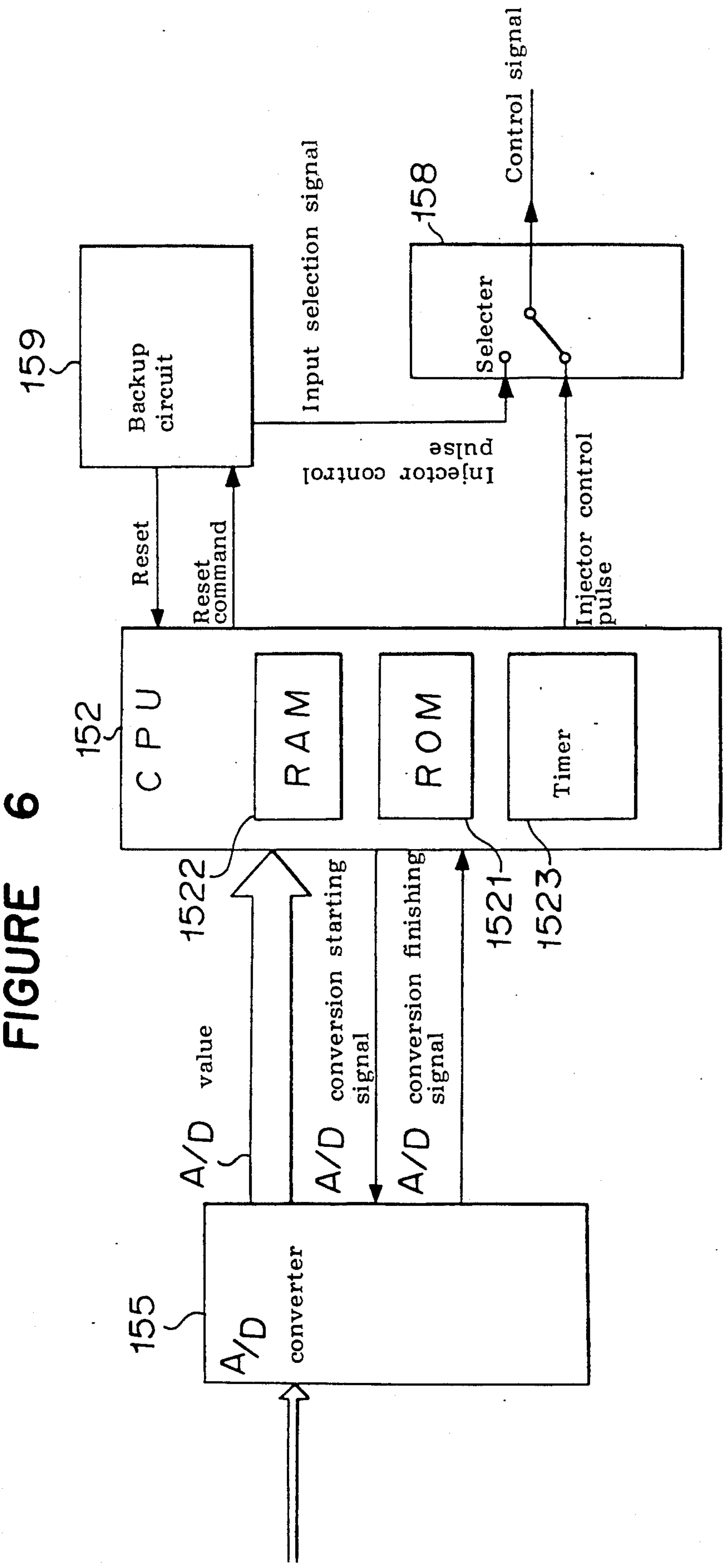
FIG. 6 is a block diagram showing the main parts of the engine control apparatus of the second embodiment.

Referring to FIGS. 5 and 6, a backup circuit 159 receives a reset demand signal from the CPU 152, it outputs a reset signal to a reset terminal of the CPU 152 to thereby render the CPU in an initial state. The backup circuit 159 produces an injector control signal in synchronism with the output of the crank angle sensor 13. The ECU 15 is adapted to switch the input signal of the selector 158 from the CPU 152 to the backup circuit 159 when the CPU 152 is reset. The other construction of the ECU 15 is the same as that shown in FIG. 2.

Figure 7:
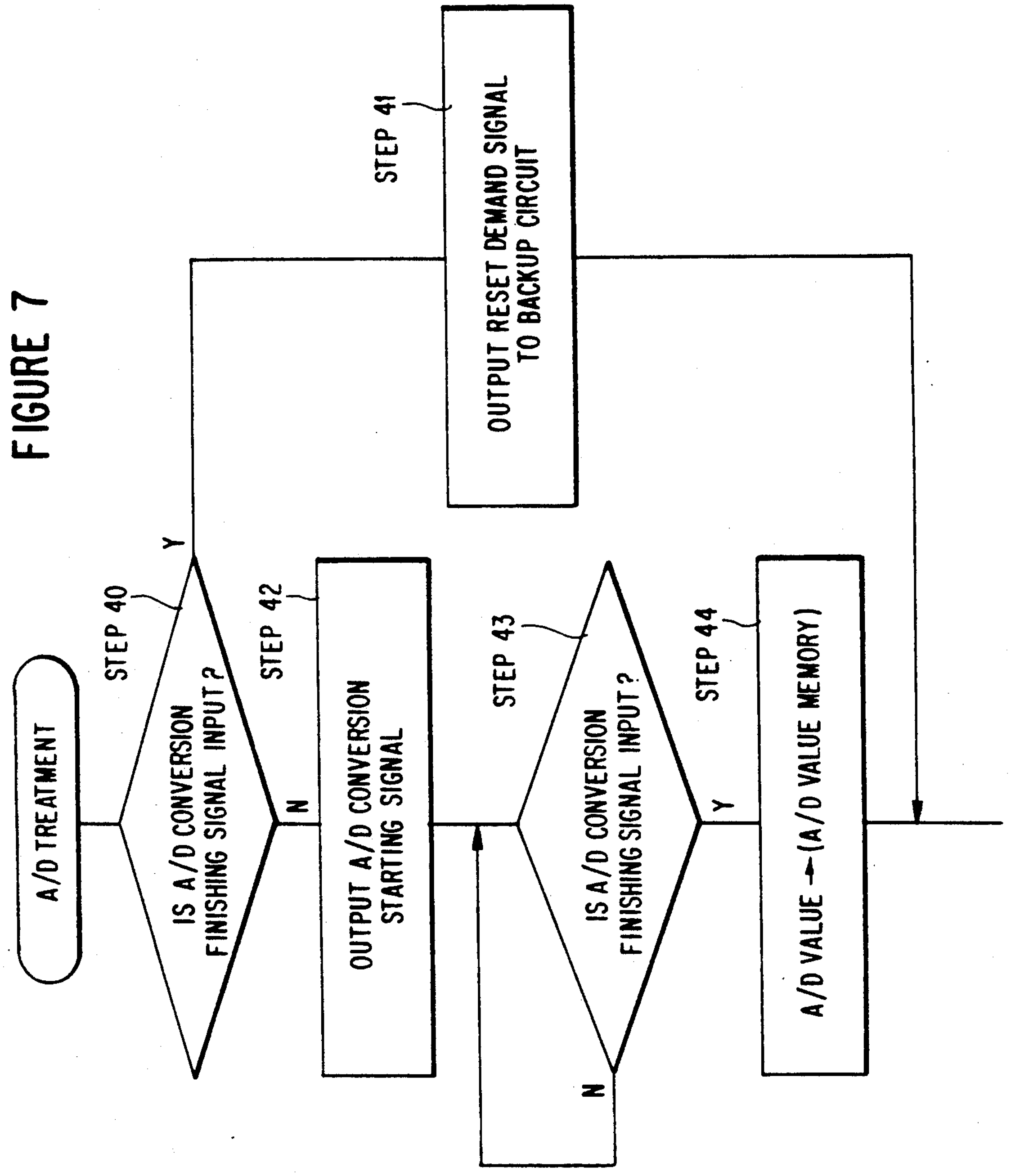
FIG. 7 is a flow chart showing the operation of the engine control apparatus of the present invention.

The operation of the second embodiment of the present invention will be described with reference to the diagram of FIG. 6 and the flow chart in FIG. 7.

At Step 40, a determination is made as to whether or not the A/D conversion finishing signal of the A/D converter 155 is inputted to the CPU 152. When the determination is affirmative, the judgment that the A/D converter 155 operates in any abnormal state is made, and the A/D converting operation is stopped. At the same time, a reset command signal is output from the CPU 152 to the backup circuit 159 at Step 41. By using the reset demand signal as a trigger signal, the backup circuit 159 outputs a reset signal to the CPU 152 so that the CPU 152 is reset to an initial state. At the same time, an input selection signal is input to the selector 158 so that the input signal of the selector 158 is switched from the CPU 152 to the backup circuit 159. Accordingly, an injector control pulse signal which is produced in the backup circuit 159 in response to the output of the crank angle sensor 13 is input to the driving circuit 156, whereby the injector 10 is driven in accordance with the injector control pulse.

In a case where the A/D conversion finishing signal is not input to the CPU 152, the judgment that the A/D converter 155 operates normally is made, and the A/D conversion starting signal is outputted from the CPU 152 to the A/D converter 155 at Step 42.

At Step 43, a determination is made as to whether or not the A/D conversion finishing signal is input from the A/D converter 155 to the CPU 152. When the determination is affirmative, the A/D value is stored in the A/D value storing memory at Step 44. The CPU 152 calculates the injector control quantity on the basis of the A/D value so that the driving circuit 156 actuates the injector 10 through the selector 158 in accordance with the control quantity.

Thus, in accordance with the second embodiment, the injector 10 is controlled in accordance with the A/D value when the A/D converter 155 operates normally, and the injector 10 is controlled in accordance with the injector control quantity produced by the backup circuit 159 when the A/D converter 155 falls in an abnormal state. Accordingly, a relatively correct control can be effected to the injector even when the A/D converter 155 is in an abnormal state.

In the first and second embodiments, abnormality in the A/D converter 155 is detected by detecting the presence or absence of the A/D conversion finishing signal. However, the abnormality detection of the A/D converter 155 may be detected by detecting the presence or absence of the A/D conversion starting signal.

Thus, in accordance with the present invention, precise control can be effected for the engine even when the A/D converter is in an abnormal condition, whereby the danger of engine stoppage or engine break down can be avoided.

Obviously, numerous modifications and variations of the present invention are possible in light of the above teachings. It is therefore to be understood that within the scope of the appended claims, the invention may be practiced otherwise than as specifically described herein.

What is claimed is:

1. A method for operating a control apparatus for an engine having a plurality of controlled sections, said method comprising the steps of:

detecting at least one analog signal representative of operational condition of said engine;

converting said analog signal into a digital output;

detecting whether an abnormality occurs in said converting step;

when said abnormality does not occur, calculating a control quantity for said engine based on said digital output;

when said abnormality does occur, calculating said control quantity for said engine based on a previously determined fixed value in place of said digital output; and actuating at least one of said controlled sections of said engine in accordance with said control quantity;

wherein said detecting step further comprises the step of examining, at the beginning of each operation, whether an A/D conversion finishing signal is present so as to permit, when said finishing signal is present, a determination of occurrence of said abnormality during said converting step.

2. A control apparatus having first and second operating states for an engine having a plurality of controlled sections, comprising:

operational condition detecting means for detecting the operational condition of an engine;

an A/D converter for converting an analog output from said operational condition detecting means into a digital output;

abnormality detecting means for detecting an abnormality in said A/D converter;

arithmetic means for calculating a control quantity for said engine based on said digital output from said A/D converter during said first operating state and for calculating said control quantity for said engine based on a previously determined fixed value in place of said digital output during said second operating state, wherein said first operating state and said second operating state are selected in response to a determination made by said abnormality detecting means; and driving means for actuating at least one of said controlled sections of said engine in accordance with said control quantity;

wherein said arithmetic means further comprises a control processing unit and wherein said abnormality detecting means further comprises means for examining, at the beginning of each operation, whether an A/D conversion finishing signal is input from said A/D converter to said control processing unit so as to permit, when said finishing signal is present, said determination, said determination being indicative of erroneous operation in said A/D converter.

3. A method for operating a control apparatus for an engine having a plurality of controlled sections, said method comprising the steps of:

detecting at least one analog signal indicating operational condition of said engine;

converting said analog signal into a digital output;

detecting whether an abnormality occurs in said converting step;

when said abnormality does not occur, calculating a first control quantity for said engine based on said digital output;

when said abnormality does occur, generating a second control quantity for said engine and a reset signal for said control system; and actuating at least one of said controlled sections of said engine in accordance with a selected one of said first control quantity and said second control quantity based on said reset signal;

wherein said detecting step further comprises the step of examining, at the beginning of each operation, whether an A/D conversion finishing signal is provided after completion of said converting step so as to permit determination of occurrence of said abnormality during said converting step.

4. A control apparatus for an engine having a plurality of controlled sections, comprising:

operational condition detecting means for detecting the operational condition of an engine;

an A/D converter for converting an analog output from said operational condition detecting means into a digital output;

abnormality detecting means for detecting an abnormality in said A/D converter;

arithmetic means for calculating a first control quantity for said engine based on said digital output of said A/D converter;

a backup circuit for generating a second control quantity for said engine and for resetting said arithmetic means based on detection of an abnormal state of said A/D converter; and driving means for actuating at least one of said controlled sections of said engine in accordance with said first control quantity from said arithmetic means and for actuating said at least one of said controlled sections of said engine in accordance with said second control quantity provided by said backup circuit in response to said resetting of said arithmetic means;

wherein said arithmetic means comprises a control processing unit and wherein said abnormality determining means further comprises means for examining, at the beginning of each operation, whether an A/D conversion finishing signal is provided from said A/D converter to said control processing unit, so as to permit determination of erroneous operation in said A/D converter.

* * * * *